(12) United States Patent
Chen et al.

(10) Patent No.: US 11,404,273 B2
(45) Date of Patent: Aug. 2, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhu Chen, Shanghai (CN); He Zuopeng, Shanghai (CN); Yang Ming, Shanghai (CN); Yao Dalin, Shanghai (CN); Bei Duohui, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 17/155,483

(22) Filed: Jan. 22, 2021

(65) Prior Publication Data
US 2021/0391173 A1  Dec. 16, 2021

(30) Foreign Application Priority Data
Jun. 10, 2020 (CN) .......................... 202010524386.1

(51) Int. Cl.
*H01L 21/033* (2006.01)
*H01L 21/311* (2006.01)
*H01L 21/768* (2006.01)

(52) U.S. Cl.
CPC .... *H01L 21/0337* (2013.01); *H01L 21/31144* (2013.01); *H01L 21/76816* (2013.01);
(Continued)

(58) Field of Classification Search
CPC ........... H01L 21/0337; H01L 21/31144; H01L 21/76816; H01L 21/0332; H01L 21/31116; H01L 21/31122
See application file for complete search history.

(56) References Cited

U.S. PATENT DOCUMENTS

| | | | |
|---|---|---|---|
| 10,361,286 B2* | 7/2019 | Tseng | H01L 29/6656 |
| 2014/0273442 A1* | 9/2014 | Liu | H01L 21/3086 |
| | | | 438/666 |

(Continued)

*Primary Examiner* — Binh X Tran
(74) *Attorney, Agent, or Firm* — Crowell & Moring, LLP

(57) ABSTRACT

The present disclosure provides a semiconductor structure and a forming method thereof. One form of a forming method includes: providing a base; forming a plurality of discrete mandrel layers on the base, where an extending direction of the mandrel layers is a first direction, and a direction perpendicular to the first direction is a second direction; forming a plurality of spacer layers covering side walls of the mandrel layers; forming a pattern transfer layer on the base, where the pattern transfer layer covers side walls of the spacer layers; forming a first trench in the pattern transfer layer between adjacent spacer layers in the second direction; removing a mandrel layer to form a second trench after the first trench is formed; and etching the base along the first trench and the second trench to form a target pattern by using the pattern transfer layer and the spacer layer as a mask. In the present disclosure, the accuracy of the pattern transfer is improved.

16 Claims, 8 Drawing Sheets

(52) U.S. Cl.
CPC ..... *H01L 21/0332* (2013.01); *H01L 21/31116* (2013.01); *H01L 21/31122* (2013.01)

(56) References Cited

U.S. PATENT DOCUMENTS

| | | | |
|---|---|---|---|
| 2020/0373199 A1* | 11/2020 | Cheng | H01L 21/76808 |
| 2020/0411366 A1* | 12/2020 | Shi | H01L 21/76816 |
| 2021/0083144 A1* | 3/2021 | Xiang | H01L 33/06 |
| 2021/0225766 A1* | 7/2021 | You | H01L 29/42372 |

* cited by examiner

SEMICONDUCTOR STRUCTURE AND FORMING METHOD THEREOF

RELATED APPLICATIONS

The present application claims priority to Chinese Patent Appln. No. 202010524386.1, filed Jun. 10, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the rapid growth of the semiconductor integrated circuit (IC) industry, semiconductor technology continues to develop toward smaller process nodes driven by Moore's Law, so that ICs develop toward a direction of smaller size, higher circuit precision, and higher circuit complexity.

In the development process of the ICs, generally, as a functional density (that is, a quantity of interconnection structures per chip) gradually increases, the geometric size (that is, the smallest component size that can be produced by using process steps) gradually decreases, which accordingly increases the difficulty and complexity of manufacturing the ICs.

Currently, as technological nodes become increasingly small, how to increase a matching degree between a pattern formed on a wafer and a target pattern has become a challenge.

SUMMARY

The problem to be addressed by embodiments and implementations of the present disclosure is to provide a semiconductor structure and a forming method thereof to improve the accuracy of pattern transfer.

To address the foregoing problems, one form of the present disclosure provides a forming method of a semiconductor structure, including: providing a base; forming a plurality of discrete mandrel layers on the base, where an extending direction of the mandrel layers is a first direction, and a direction perpendicular to the first direction is a second direction; forming a plurality of spacer layers covering side walls of the mandrel layers; forming a pattern transfer layer on the base, where the pattern transfer layer covers a side wall of the spacer layers; forming a first trench in the pattern transfer layer between adjacent spacer layers of the plurality of spacer layers in the second direction; removing a mandrel layer of the plurality of mandrel layers to form a second trench after the first trench is formed; and etching the base along the first trench and the second trench to form a target pattern by using the pattern transfer layer and the spacer layer as a mask.

Another form of the present disclosure provides a semiconductor structure, including: a base; a plurality of discrete mandrel layers, located on the base, where an extending direction of the mandrel layers is a first direction, and a direction perpendicular to the first direction is a second direction; a plurality of spacer layers, located on side walls of the mandrel layers; a pattern transfer layer, located on the base and covering a side wall of the spacer layers; and a trench, located in the pattern transfer layer between adjacent spacer layers along the second direction.

In comparison to the prior art, technical solutions of embodiments and implementations of the present disclosure have the following advantages:

In embodiments and implementations of the present disclosure, a mandrel layer is formed on a base to occupy a position of a second trench. Compared with a solution of directly forming a second trench in a pattern transfer layer, the mandrel layer protrudes from the base. Therefore, it is easy to form the mandrel layer with a relatively small size, and the size and position of the mandrel layer have relatively high accuracy, which is correspondingly beneficial to accurately controlling pattern accuracy of the subsequently formed second trench. Moreover, after the spacer layer covering the side wall of the mandrel layer is formed, the pattern transfer layer is formed on the base, the pattern transfer layer covers the side wall of the spacer layer, and in the second direction, the first trench is formed in the pattern transfer layer between the adjacent spacer layers. The size and position of the mandrel layer have relatively high accuracy, which correspondingly improves the accuracy of the size and position of the first trench. In summary, a manner of first forming the mandrel layer and then forming the first trench is beneficial to improving the pattern accuracy of the first trench and the second trench, thereby improving the pattern accuracy of the target pattern, and correspondingly improving the accuracy of pattern transfer.

DETAILED DESCRIPTION

As can be known from the related art, as technological nodes become increasingly small, how to improve a matching degree between a target pattern formed on a wafer and a designed pattern has become a challenge.

It is found through research that a pitch between photoresist patterns keeps decreasing as the technological nodes become increasingly small. However, under the influence of a photolithography process, when a pitch between adjacent photolithographic patterns is less than a threshold distance of the photolithography process, the photoresist patterns tend to deform or distort. Correspondingly, when the photoresist patterns are transferred to a base to form a target pattern (for example, a trench), pattern accuracy of the target pattern is reduced, and the accuracy of pattern transfer is further reduced.

To address the technical problems, in embodiments and implementations of the present disclosure, a mandrel layer is formed on a base to occupy a position of a second trench. Compared with a solution of directly forming a second trench in a pattern transfer layer, the mandrel layer protrudes from the base. Therefore, it is easy to form the mandrel layer with a relatively small size, and the size and position of the mandrel layer have relatively high accuracy, which is correspondingly beneficial to accurately controlling pattern accuracy of the subsequently formed second trench. Moreover, after a spacer layer covering a side wall of the mandrel layer is formed, a pattern transfer layer is formed on the base, where the pattern transfer layer covers a side wall of the spacer layer, and in a second direction, a first trench is formed in the pattern transfer layer between adjacent spacer layers. The size and position of the mandrel layer have relatively high accuracy, which correspondingly improves the accuracy of the size and position of the first trench. In summary, a manner of first forming the mandrel layer and then forming the first trench is beneficial to improving the pattern accuracy of the first trench and the second trench, thereby improving the pattern accuracy of the target pattern, and correspondingly improving the accuracy of pattern transfer.

To make the foregoing objectives, features, and advantages of the embodiments and implementations of the present disclosure more clearly understood, specific embodiments and implementations of the present disclosure are described in detail below with reference to the drawings.

FIG. 1 to FIG. 22 are schematic structural diagrams corresponding to steps in one form of a forming method of a semiconductor structure according to the present disclosure.

Figure 1:
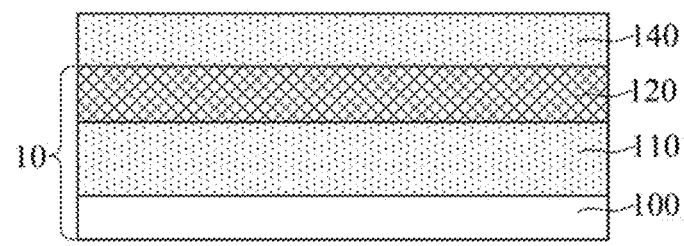
FIG. 1 to FIG. 22 are schematic structural diagrams corresponding to steps in one form of a forming method of a semiconductor structure according to the present disclosure.

Referring to FIG. 1, a base 10 is provided.

The base 10 is configured to provide a process platform for subsequent manufacturing procedure. In some implementations, the base 10 includes a base structure layer 100, and the base structure layer 100 includes a substrate. For example, the formed semiconductor structure is a planar transistor, the substrate is a planar substrate. Specifically, the substrate is a silicon substrate. In other implementations, the material of the substrate may alternatively be other materials such as germanium, silicon germanide, silicon carbide, gallium arsenide, or indium gallide, and the substrate may alternatively be other types of substrates such as a silicon substrate on an insulator, or a germanium substrate on the insulator. In other implementations, when the formed semiconductor structure is a fin field effect transistor, the substrate may alternatively be a substrate with fins.

The base structure layer 100 may further include other structures, such as a gate structure, a doped region, a shallow trench isolation (STI) structure, and a dielectric layer. Specifically, the base structure layer 100 further includes an interlayer dielectric layer (not shown) formed on the substrate and a contact (CT) hole plug (not shown) formed in the interlayer dielectric layer.

In some implementations, the base 10 further includes a hard mask material layer 120 located on the base structure layer 100. After the hard mask material layer 120 is subsequently patterned, the patterned hard mask material layer 120 transfers a pattern downward. It is beneficial to improving the stability of a patterning process and the accuracy of the pattern transfer using the hard mask material layer 120.

In some implementations, the material of the hard mask (HM) material layer 120 may include at least one of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, or tungsten nitride. In an example, the HM material layer 120 is a metal HM material layer, and the material of the HM material layer 120 is titanium nitride.

The base 10 further includes a dielectric layer 110 located between the base structure layer 100 and the HM material layer 120. In some implementations, the dielectric layer 110 is an inter metal dielectric (IMD) layer, and the dielectric layer 110 is configured to implement electric isolation between metal interconnection structures in a back end of line (BEOL) manufacturing procedure. In an example, the dielectric layer 110 is a first IMD layer and is configured to implement electric isolation between first metal interconnection lines (that is, M1 layers). The first metal interconnection line refers to the metal interconnection structure closest to the contact hole plug.

In other implementations, the dielectric layer may alternatively be another IMD located on the first metal interconnection line and be configured to implement electric isolation between other interconnection structures. For example, the dielectric layer is a second IMD and is configured to implement electric isolation between a second metal interconnection line and a via interconnection structure located between the second metal interconnection line and the first metal interconnection line. Therefore, the material of the dielectric layer 110 is a low-k dielectric material (the low-k dielectric material refers to a dielectric material with a relative dielectric constant greater than or equal to 2.6 and less than or equal to 3.9), an ultra-low-k dielectric material (the ultra-low-k dielectric material refers to a dielectric material with a relative dielectric constant less than 2.6), silicon oxide, silicon nitride, or silicon oxynitride. In some implementations, the material of the dielectric layer 110 is the ultra-low-k dielectric material, thereby reducing a parasitic capacitance between the metal interconnection structures in the BEOL, and further reducing RC delay in the BEOL. Specifically, the ultra-low-k dielectric material may be SiOCH.

It should be noted that the forming method further includes: forming a protective layer 140 on the HM material layer 120. The protective layer 140 is configured to protect the HM material layer 120. A mandrel layer is further formed on the HM material layer 120 subsequently. The protective layer 140 is configured to define a stop position of etching during an etching process procedure for forming the mandrel layer, thereby reducing the probability of damage to the HM material layer 120, and further improving the accuracy of the pattern formed in the HM material layer 120. In some implementations, the material of the protective layer 140 is silicon oxide.

Figure 2:
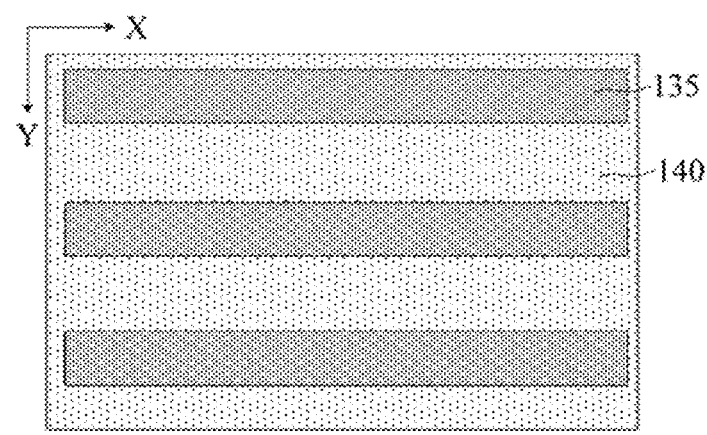
Figure 3:
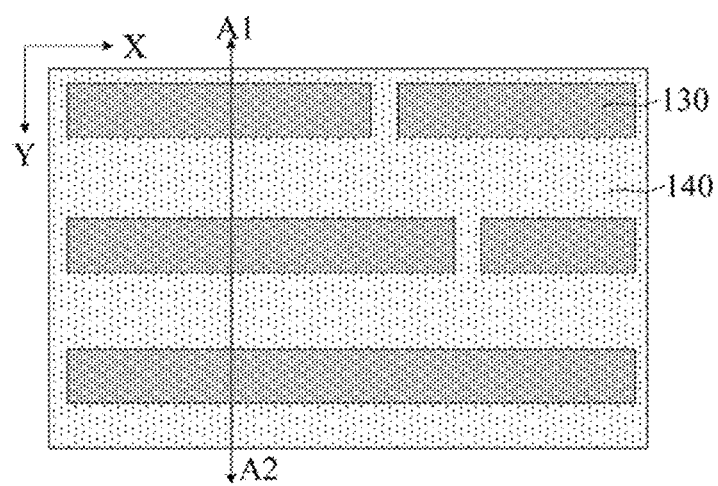
Figure 4:
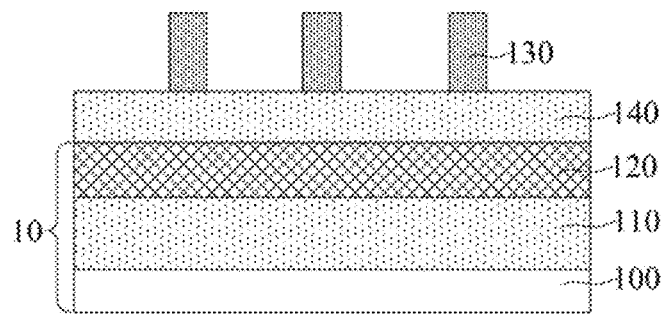

With reference to FIG. 2 to FIG. 4, FIG. 2 and FIG. 3 are top views, and FIG. 4 is a cross-sectional view of FIG. 3 taken along a line A1A2. A plurality of discrete mandrel layers 130 are formed on the base 10. An extending direction of the mandrel layer 130 is a first direction (shown as an X direction in FIG. 3), and a direction perpendicular to the first direction is a second direction (shown as a Y direction in FIG. 3).

The mandrel layer 130 is configured to occupy space for subsequent formation of a second trench to define the pattern and position of the second groove. Compared with the solution of directly forming the second trench in the pattern transfer layer using the etching process, the mandrel layer protrudes from the base. Therefore, it is easy to form the mandrel layer with a relatively small size, and the size and position of the mandrel layer have relatively high accuracy, which is correspondingly beneficial to reducing the difficulty in forming the second trench and accurately controlling pattern accuracy of the second trench. The second trench is configured to define the patterns and positions of part of the target patterns, which is correspondingly beneficial to improving the pattern accuracy of the target patterns. In addition, a spacer layer is further formed on a side wall of the mandrel layer 130 subsequently, and the mandrel layer 130 further provides support for forming the spacer layer.

The mandrel layer 130 is further removed subsequently. Therefore, the material of the mandrel layer 130 is a material that is easily to be removed, thereby reducing the difficulty in removing the mandrel layer 130 and reducing damage to other film layers located below the mandrel layer 130. Therefore, the material of the mandrel layer 130 includes one or more of amorphous silicon, polycrystalline silicon, monocrystalline silicon, silicon oxide, advanced patterning film (APF) materials, spin on carbon (SOC), and silicon carbide. In some implementations, the mandrel layer 130 is amorphous silicon.

Specifically, the step of forming a plurality of discrete mandrel layers 130 includes: as shown in FIG. 2, forming a plurality of discrete initial mandrel layers 135 on the protective layer 140, an extending direction of the initial mandrel layer 135 being a first direction (shown as an X direction in FIG. 2), and a direction perpendicular to the first direction being a second direction (shown as a Y direction in FIG. 3); and as shown in FIG. 3, cutting the initial mandrel layer 135 to divide the initial mandrel layer 135 into spaced mandrel layers 130 in the first direction. By forming the initial mandrel layer 135 first and cutting the initial mandrel layer 135, a space between adjacent mandrel layers 130 in the first direction can be flexibly adjusted, a smaller space can be achieved and heads of the adjacent mandrel layers 130 are not easy to be connected at a head-to-head position of the adjacent mandrel layers 130, and the morphology quality of the mandrel layer 130 at the head-to-head position is better, thereby being conductive to improving the flexibility of the layout design of the target pattern and improving the pattern accuracy of the target pattern. In other implementations, when the space between the adjacent mandrel layers in the first direction is relatively large, a mask may be used to directly define a shape of the mandrel layer, that is, there is no need to cut the mandrel layer.

Figure 5:
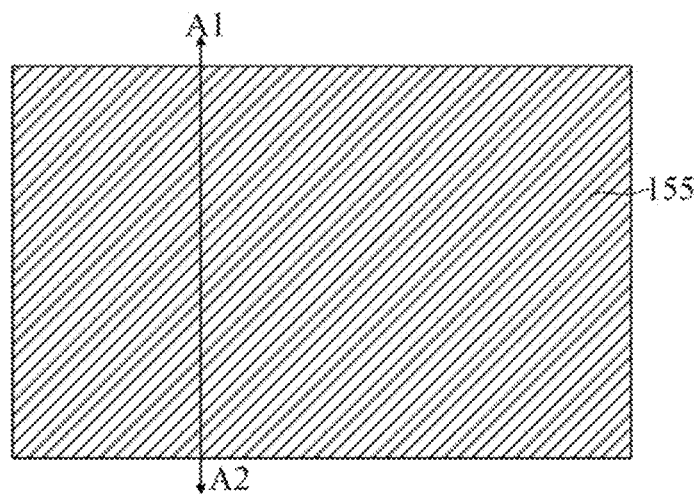
Figure 6:
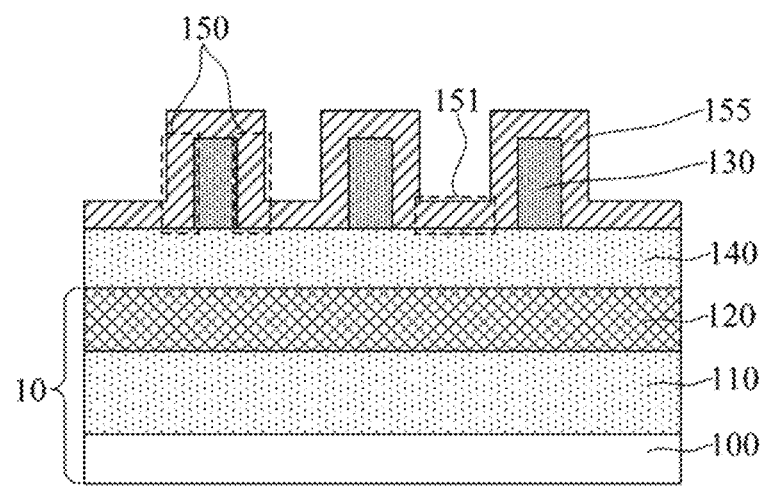

With reference to FIG. 5 and FIG. 6, FIG. 5 is a top view, and FIG. 6 is a cross-sectional view of FIG. 5 taken along the line A1A2. A spacer layer 150 covering the side wall of the mandrel layer 130 is formed.

The mandrel layer 130 is configured to occupy space for subsequent formation of a second groove. After a pattern transfer layer covering the side wall of the spacer layer 150 is formed on the base 10 subsequently, in the second direction (shown as the Y direction in FIG. 3), a first trench is formed in the pattern transfer layer between adjacent spacer layers 150. The spacer layer 150 is configured to isolate the second trench from the first trench and prevent the problem of communication between the second trench and the first trench, so that a space between the adjacent second trench and first trench meets a designed minimum space. Moreover, when patterns of the second trench and the first trench are subsequently transferred to the base 10, the spacer layer 150 is used as a mask for etching the base 10. In addition, the spacer layer 150 is configured to adjust the space between the second trench and the first trench in the second direction. Further, the space between the adjacent mandrel layers 130 along the first direction (shown as the X direction in FIG. 3) is used to define the space between the second trenches. The spacer layer 150 is formed on the side wall of the mandrel layer 130. The spacer layer 150 is used as an outer spacer. Compared with the solution of first forming the second trench and then forming an inner spacer on the side wall of the second trench, the outer spacer is formed on the side wall of the mandrel layer 130, and the space between the adjacent first grooves along the first direction is not the sum of the space between the mandrel layers and twice the thickness of the spacer layer, which is beneficial to achieving a smaller space between the adjacent second trenches along the first direction.

The spacer layer 150 is made of a material that has etching selectivity with the mandrel layer 130, the protective layer 140, and the subsequently formed pattern transfer layer. The material of the spacer layer 150 includes at least one of titanium oxide, titanium nitride, silicon oxide, silicon nitride, silicon oxynitride, or silicon carbide. In some implementations, the material of the spacer layer 150 is silicon nitride.

As shown in FIG. 6, the step of forming the spacer layer 150 includes: forming a spacer material layer 155 conformally covering the mandrel layer 130 and the protective layer 140. The spacer material layer 155 located on the side wall of the mandrel layer 130 is used as the spacer layer 150. In some implementations, the spacer material layer 155 is formed using an atomic layer deposition process, so that the thickness uniformity of the spacer material layer 155 is good, and the spacer material layer 155 has high step coverage capacity. Therefore, the spacer material layer 155 can well cover corners of the mandrel layer 130 and the protective layer 140. In an example, after the spacer material layer 155 is formed, the spacer material layer 155 located on the top of the protective layer 140 is used as a bottom remaining layer 151.

In some implementations, in the first direction, the spacer layers 150 on the side walls of the adjacent mandrel layers 130 are in contact. The side wall of the mandrel layer 130 in the first direction is the head of the mandrel layer 130. The spacer layer 150 located between the adjacent mandrel layers 130 in the first direction is configured to implement isolation between the adjacent mandrel layers 130 in the first direction. In other implementations, when the space between the second trenches in the first direction is relatively large, the spacer layers on the side walls of the adjacent mandrel layers may alternatively be spaced in the first direction.

It should be noted that the mandrel layer 130 needs to be removed subsequently to form the second trench. Therefore, the subsequent manufacturing procedure further includes: etching back, before the mandrel layer 130 is removed, the spacer material layer 155 to remove the spacer material layer 155 higher than a top surface of the mandrel layer 130.

In an example, after the spacer material layer 155 is formed, the spacer material layer 155 located on the top surface of the mandrel layer 130 is first retained. A pattern transfer layer is further formed on the base 10 subsequently, and the manufacturing procedure of forming the pattern transfer layer includes a step of planarization. A stop position of the planarization is defined by using the spacer material layer 155 located on the top surface of the mandrel layer 130, thereby improving the flatness of a top surface of the pattern transfer layer. Moreover, in the process of forming a mask spacer 170, the spacer material layer 155 conformally covers the mandrel layer 130 and the protective layer 140, that is, the spacer material layer 155 is not etched, which enables a width range of the mask spacer 170 not to be affected by the photolithography process. A width of the mask spacer 170 can be made very small, so that the subsequently formed space between the adjacent second trench and first trench can meet the designed minimum space, and the mask spacer 170 still has good position accuracy and morphological accuracy, to avoid the problem of an alignment error caused by the prior photolithography process.

Figure 8:
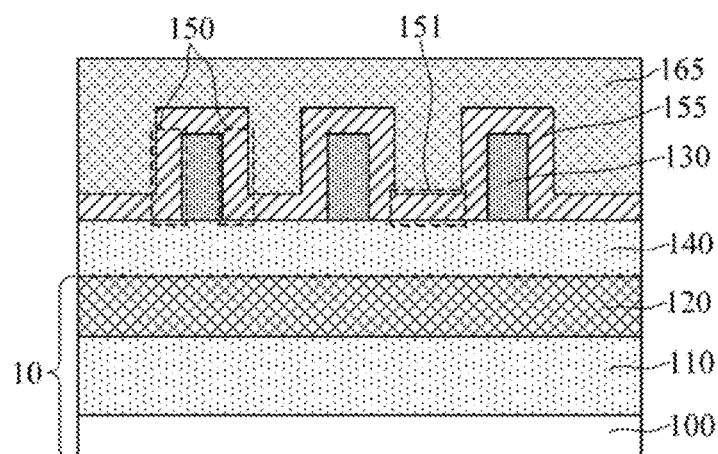
Figure 9:
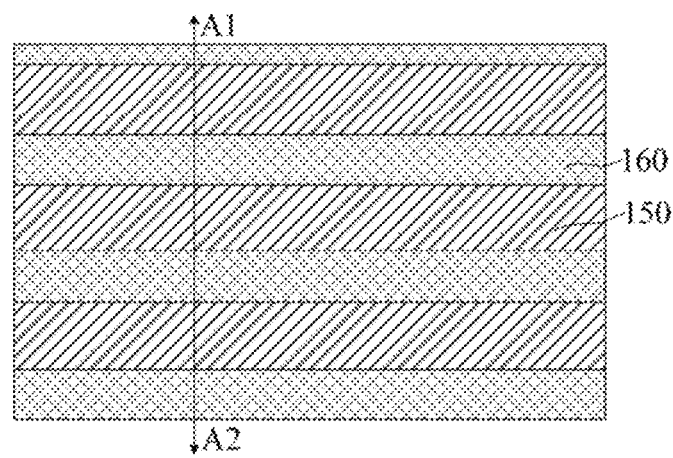
Figure 10:
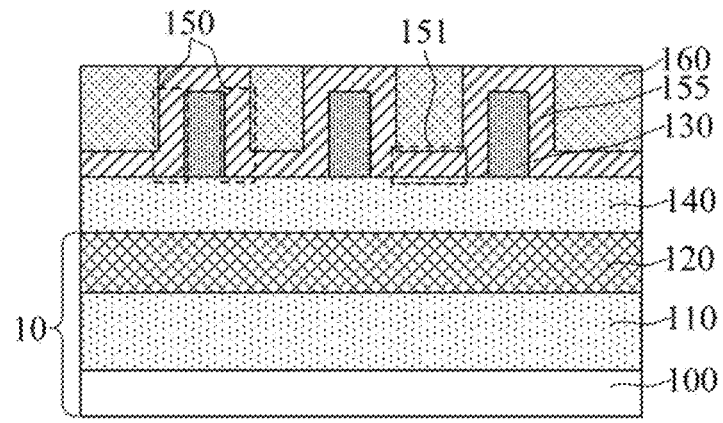

With reference to FIG. 7 to FIG. 10, a pattern transfer layer 160 (as shown in FIG. 10) is formed on the base 10, and the pattern transfer layer 160 covers the side wall of the spacer layer 150.

The pattern transfer layer 160 is configured to provide the process platform for the subsequent formation of the first trench and the second trench, that is, the first trench and the second trench are formed in the pattern transfer layer 160. In addition, after the first trench and the second trench are formed, the remaining pattern transfer layer 160 is further configured to be used as a mask for etching the base 10, so as to transfer the patterns of the first trench and the second trench to the base 10.

Figure 7:
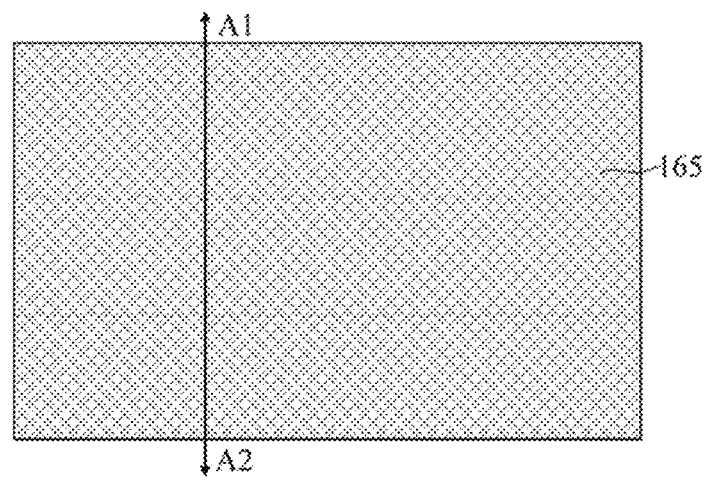

Specifically, the step of forming the pattern transfer layer 160 includes the following:

Referring to FIG. 7 and FIG. 8, FIG. 7 is a top view, and FIG. 8 is a cross-sectional view of FIG. 7 taken along the line A1A2. A pattern transfer material layer 165 covering the spacer material layer 155 is formed. The pattern transfer material layer 165 after planarization is configured to be used as a pattern transfer layer.

In some implementations, the material of the pattern transfer material layer 165 is silicon oxide. The pattern transfer material layer 165 is formed by performing a deposition process and a planarization process in sequence. By using silicon oxide, it is easy to form the pattern transfer material layer 165 with a top surface that has relatively high flatness, thereby improving the flatness of the top surface of the subsequently formed pattern transfer layer. In addition, an etching selection ratio of silicon oxide to silicon nitride is relatively high, and the etching selection ratio of silicon oxide to amorphous silicon is also relatively high, which is beneficial to reducing the damage to the mandrel layer 130 or the spacer layer 150 in the subsequent process of etching the pattern transfer layer to form the first trench. In some implementations, in the step of forming the pattern transfer material layer 165, the deposition process is a flowable chemical vapor deposition (FCVD) process. The FCVD has better fluidity, which is beneficial to improving the flatness of the top surface of the pattern transfer material layer 165. In other implementations, the material of the pattern transfer material layer may alternatively be metal oxide. The metal oxide includes spin-on metal oxide (for example: titanium oxide).

In some implementations, the pattern transfer material layer 165 is formed on the base 10 exposed by the mandrel layer 130 and the spacer layer 150. It should be noted that, in other implementations, when the spacer layers on the side walls of the adjacent mandrel layers are spaced in the first direction, the pattern transfer material layer further fills between the adjacent spacer layers in the first direction.

Referring to FIG. 9 and FIG. 10, FIG. 9 is a top view, and FIG. 10 is a cross-sectional view of FIG. 9 taken along the line A1A2. The planarization is performed on the pattern transfer material layer 165 (as shown in FIG. 8), the pattern transfer material layer 165 higher than the top surface of the spacer material layer 155 is removed, and the remaining pattern transfer material layer 165 is used as the pattern transfer layer 160.

After the spacer material layer 155 is formed, the spacer material layer 155 located on the top surface of the mandrel layer 130 is retained. Therefore, in the process of performing the planarization on the pattern transfer material layer 165, the spacer material layer 155 located on the top surface of the mandrel layer 130 is configured to define the stop position of the planarization, thereby being beneficial to improving the flatness of the top surface of the pattern transfer layer 160. Specifically, a chemical mechanical polishing process is used to perform the planarization, so that the spacer material layer 155 located on the top surface of the mandrel layer 130 is used as the stop position of the planarization.

Figure 11:
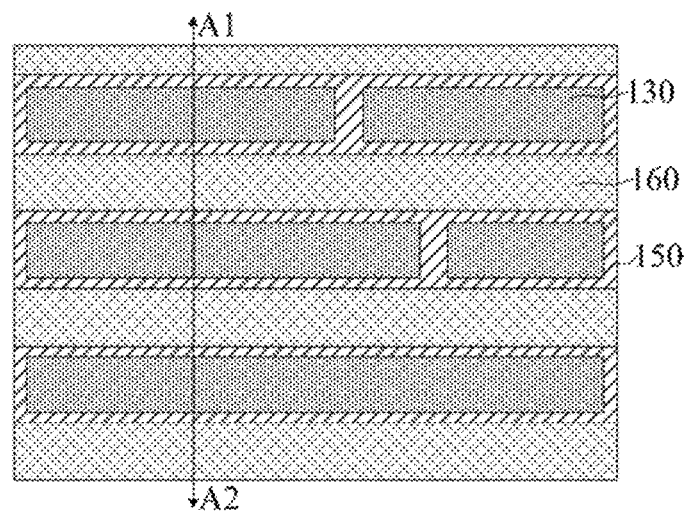
Figure 12:
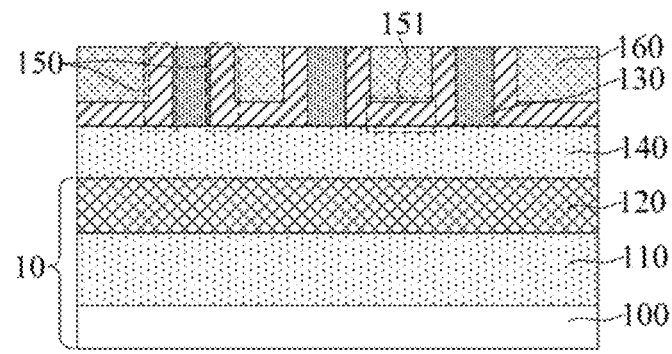

Referring to FIG. 11 and FIG. 12, FIG. 11 is a top view, and FIG. 12 is a cross-sectional view of FIG. 11 taken along the line A1A2. The pattern transfer layer 160 is etched back, so that the top surface of the remaining pattern transfer layer 160 is flush with the top surface of the mandrel layer 130.

The spacer material layer 155 is further etched back subsequently (as shown in FIG. 10) to remove the spacer material layer 155 higher than the top surface of the mandrel layer 130, and then the mandrel layer 130 is further removed. By etching back the pattern transfer layer 160, the top surface of the mandrel layer 130 can be better exposed, thereby reducing process difficulty in removing the mandrel layer 130.

Specifically, a dry etching process (for example, an anisotropic dry etching process) is used to etch back the pattern transfer layer 160. The dry etching process has the characteristics of anisotropic etching, so that the pattern transfer layer 160 can be etched along a direction perpendicular to the surface of the base 10, which is beneficial to accurately controlling an etching amount of the pattern transfer layer 160. In some other implementations, the pattern transfer layer may not be etched back, that is, the top surface of the pattern transfer layer is higher than the top surface of the mandrel layer.

With continued reference to FIG. 11 and FIG. 12, after the pattern transfer layer 160 is etched back, the spacer material layer 155 is etched back (as shown in FIG. 10) to remove the spacer material layer 155 higher than the top surface of the mandrel layer 130.

The spacer material layer 155 higher than the top surface of the mandrel layer 130 is removed to expose the top surface of the mandrel layer 130 to be prepared for the subsequent removal of the mandrel layer 130. In some implementations, the dry etching process (for example, the anisotropic dry etching process) is used to etch back the spacer material layer 155. The dry etching process has the characteristics of anisotropic etching, so that the spacer material layer 155 can be etched along a direction perpendicular to the surface of the base 10, thereby being beneficial to improving the flatness of the top surface of the spacer layer 150. Moreover, it is also beneficial to accurately controlling the etching amount of the spacer material layer 155. It should be noted that when the spacer material layer 155 is etched back, the pattern transfer layer 160 covers the bottom remaining layer 151, therefore, the bottom remaining layer 151 is retained.

In some implementations, the pattern transfer layer 160 is etched back first to prevent the mandrel layer 130 from being exposed to the environment of etching back the pattern transfer layer 160, thereby reducing the probability or extent of damage to the mandrel layer 130, which is beneficial to enabling the top surfaces of the remaining pattern transfer layer 160, the mandrel layer 130, and the spacer layer 150 to be all flush with each other, so that the top surfaces of the remaining pattern transfer layer 160 and the spacer layer 150 are flush with each other. Moreover, the material of the pattern transfer layer 160 is silicon oxide, the material of the mandrel layer 130 is amorphous silicon, and the material of the spacer layer 150 is silicon nitride. The etching selection ratio of silicon oxide to silicon nitride is higher, so that by first etching back the pattern transfer layer 160, the probability or extent of damage to the mandrel layer 130 can be significantly reduced.

In some other implementations, alternatively, the spacer material layer may be etched back first, and then the pattern transfer layer may be etched back.

In other implementations, after the spacer material layer conformally covering the mandrel layer and the base is formed and before the pattern transfer layer is formed, the spacer material layer is etched back. Moreover, in the process of etching back the spacer material layer, the spacer material layer located on the top of the mandrel layer and the base is removed, and the remaining spacer material layer located on the side wall of the mandrel layer is retained to be used as the spacer layer. When the planarization is performed on the pattern transfer material layer, the pattern transfer material layer higher than the top surface of the mandrel layer is removed, and the remaining pattern transfer material layer is used as the pattern transfer layer. Specifically, a blanket etching process is used to etch back the spacer material layer, so as to remove the spacer material layer located on the top of the mandrel layer and the base, so that the spacer material layer on the side wall of the mandrel layer is retained. In addition, the width range of the spacer layer is not affected by the photolithography process, so that the width of the spacer layer can be made very small, and the spacer layer still has good position accuracy and morphological accuracy, to avoid the problem of the alignment error caused by the prior photolithography process. The blanket etching process is anisotropic dry etching.

Figure 13:
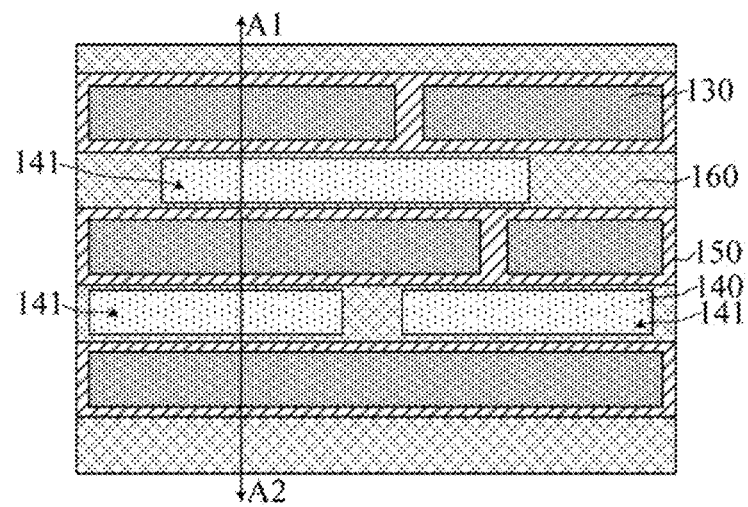
Figure 14:
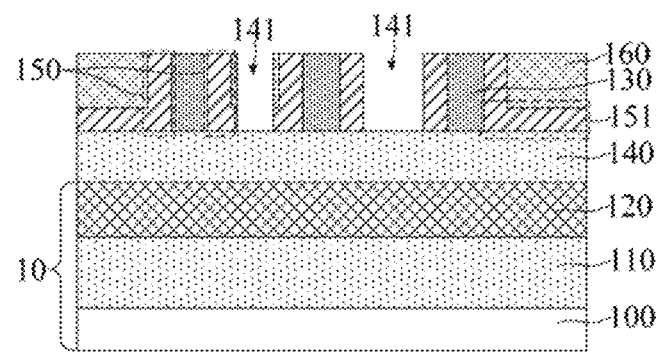

Referring to FIG. 13 and FIG. 14, FIG. 13 is a top view, and FIG. 14 is a cross-sectional view of FIG. 13 taken along the line A1A2. In the second direction (shown as the Y direction in FIG. 3), a first trench 141 is formed in the pattern transfer layer 160 between the adjacent spacer layers 150.

The first trench 141 is configured to define the shape, size, and position of some target patterns in subsequent processes. The accuracy of the size and position of the mandrel layer 130 is relatively high, which is correspondingly beneficial to improving the accuracy of the size and position of the first trench 141, and is further beneficial to improving the accuracy of the pattern transfer in subsequent processes.

In some implementations, the dry etching process is used to etch the pattern transfer layer 160 between the adjacent spacer layers 150 to form the first trench 141, for example, the anisotropic dry etching process is used. The dry etching process has the characteristics of anisotropic etching, which is beneficial to improving the morphology quality of the first trench 141, so that the morphology, size, and position of the first trench 141 can meet the process requirement. Moreover, by using the dry etching process, it is easy to control the stop position of etching to reduce damage to a film layer below the pattern transfer layer 160.

It should be noted that the bottom remaining layer 151 is formed on the base 10. Therefore, in the process of forming the first trench 141, after the pattern transfer layer 160 is etched, the bottom remaining layer 151 continues to be etched. In some implementations, the protective layer 140 is exposed by the bottom of the first trench 141.

According to the design requirements of the IC, that is, according to the subsequently formed space setting between the second trench and the first trench 141 in the second direction, after the first trench 141 is formed, in the second direction, the first trench 141 is isolated from the spacer layer 150 using the pattern transfer layer 160, or the side wall of the first trench 141 in the second direction exposes the spacer layer 150. Moreover, by adjusting the space between the first trench 141 and the spacer layer 150 in the second direction, the subsequently formed space between the second trench and the first trench 141 in the second direction is adjusted. For example, when the first trench 141 is isolated from the spacer layer 150 using the pattern transfer layer 160, the space between the second trench and the first trench 141 in the second direction is relatively large. When the side wall of the first trench 141 in the second direction exposes the spacer layer 150, the space between the second trench and the first trench 141 in the second direction is relatively small.

In some implementations, before the first trench 141 is formed, the spacer material layer 155 is etched back (as shown in FIG. 10). Therefore, in the process of etching back the spacer material layer 155, the damage to the film layer below the pattern transfer layer 160 corresponding to the position of the first trench 141 can be avoided, thereby improving the accuracy of the pattern transfer in subsequent processes.

Figure 15:
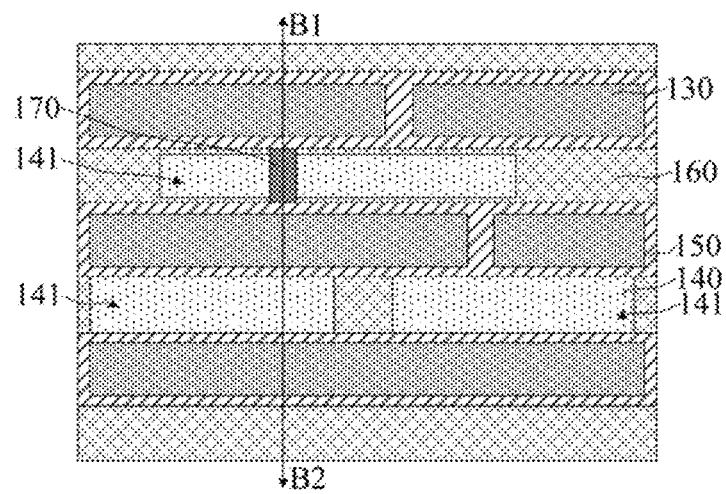
Figure 16:
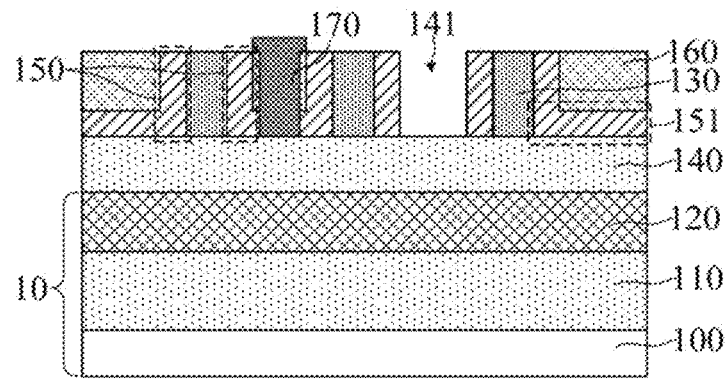

With reference to FIG. 15 and FIG. 16, FIG. 15 is a top view, and FIG. 16 is a cross-sectional view of FIG. 15 taken along a line B1B2. After the first trench 141 is formed, the forming method further includes: forming a barrier layer 170 in at least one of the first trenches 141. The barrier layer 170 divides the first trench 141 in the first direction (shown as the X direction in FIG. 3).

The barrier layer 170 is configured to be used as a cut feature of the first trench 141. When a pattern of the first trench 141 is subsequently transferred to the base 10, the barrier layer 170 also functions as an etching mask, thereby adjusting a pitch between the pattern of the first trench 141 and a target pattern corresponding to the first trench 141 in the first direction. Forming the barrier layer 170 is beneficial to increasing a process window for forming the first trench 141, thereby improving the accuracy of the pattern transfer.

Specifically, the step of forming the barrier layer 170 in the first trench 141 includes: forming a filling layer (not shown) covering the base 10, the mandrel layer 130, the spacer layer 150, and the pattern transfer layer 160; forming a third trench (not shown) in the filling layer, the third trench dividing the filling layer in the first trench 141 in the first direction; forming a barrier material layer (not shown) in the third trench, the barrier material layer further covering a top surface of the filling layer; etching back the barrier material layer, and retaining the remaining barrier material layer in the third trench to be used as the barrier layer 170; and removing the filling layer after the barrier layer 170 is formed.

The filling layer is configured to provide the process platform for the formation of the barrier layer 170. The material of the filling layer is a material that is easy to be removed, and the process of removing the filling layer has less damage to the base 10, the mandrel layer 130, the spacer layer 150, and the pattern transfer layer 160. In some implementations, the material of the filling layer is an SOC material. In other implementations, the material of the filling layer may alternatively be an organic dielectric layer (ODL) material or a bottom anti-reflective coating (BARC) material.

In some implementations, the barrier material layer is etched back using the dry etching process. It should be noted that the barrier layer 170 is formed in the third trench. Therefore, by properly setting the thickness of the filling layer and the etching amount of the barrier material layer, it is easy to enable the height of the barrier layer 170 to meet the process requirement, and process flexibility is relatively high.

In some implementations, the material of the barrier layer 170 is silicon oxide. In other implementations, the material of the barrier layer may alternatively be low temperature oxide (LTO), titanium oxide, or silicon oxycarbide.

In some implementations, the atomic layer deposition process is used to form the barrier material layer to improve the quality of the barrier material layer. In other implementations, according to the material of the barrier layer, a low-pressure chemical vapor deposition (LPCVD) process may alternatively be used to form the barrier layer. The width of the barrier layer 170 in the first direction is limited by the formation process of the barrier material layer. For example, the process of forming the barrier material layer is the atomic layer deposition process. In this case, the barrier material layers deposited on the side walls of two sides of the third trench in the first direction are in contact with each other to fill the third trench. Therefore, the width of the barrier layer 170 in the first direction is not too large, and the width of the third trench of the barrier layer in the first direction is limited.

It should also be noted that a mask spacer 150 is formed on the side wall of the mandrel layer 130. Therefore, in the second direction, even if the third trench exposes the mask spacer 150 or the pattern transfer layer 160 between the first trench 141 and the mandrel layer $130_{[SH1]}$, the formation position of the barrier layer 170 still meets the process requirement. That is, the process of forming the third trench has a relatively large process window, for example, it may relieve the limitation to the resolution of the photolithography process. In an example, in the second direction, the barrier layer 170 further extends to cover the pattern transfer layer 160 between the first trench 141 and the spacer layer 150.

In other implementations, when a pitch between the adjacent target patterns in the first direction is relatively large, the mask may be used to directly form a first trench matching the target pattern, and accordingly, there is no need to perform the manufacturing procedure of forming the barrier layer.

In some implementations, after the first trench 141 is formed and before the mandrel layer 130 is removed, the barrier layer 170 is formed. The top surfaces of the mandrel layer 130 and the mask spacer 150 are flush with each other, thereby being beneficial to reducing the process difficulty in forming the filling layer and the third trench. Moreover, the mandrel layer 130 is subsequently removed to form the second trench, in this case, the film layer at the bottom of the second trench is not exposed, which is beneficial to avoiding the damage to the film layer at the bottom of the second trench by the manufacturing procedure of forming the barrier layer 170, thereby being beneficial to improving the accuracy of the pattern transfer.

Figure 17:
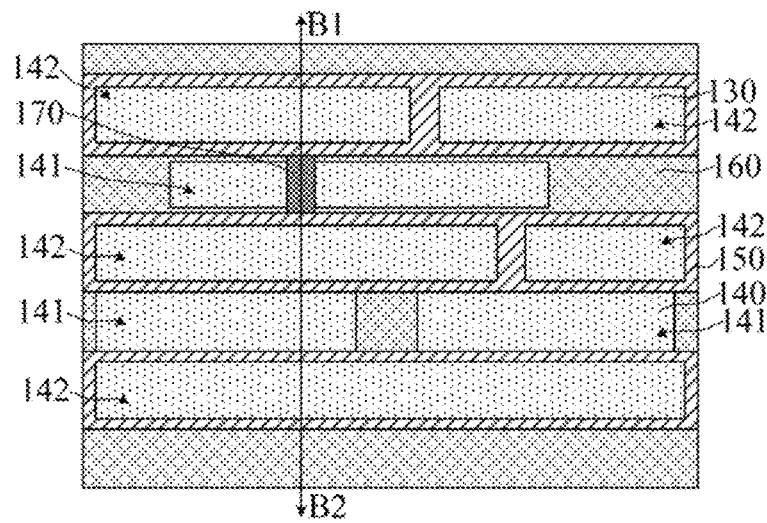
Figure 18:
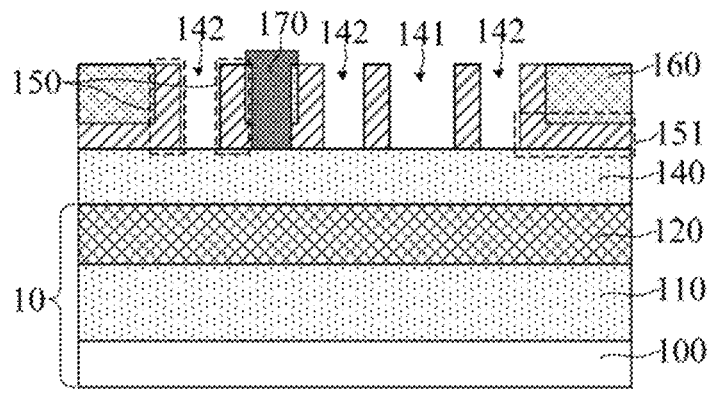

With reference to FIG. 17 and FIG. 18, FIG. 17 is a top view, and FIG. 18 is a cross-sectional view of FIG. 17 taken along the line B1B2. After the first trench 141 is formed, the mandrel layer 130 is removed to form a second trench 142.

The second trench 142 is configured to define the shape, size, and position of the remaining target pattern formed in the base 10. Because it is easy to form the mandrel layer 130 with a relatively small size, and the accuracy of the size and position of the mandrel layer 130 is relatively high, it is correspondingly beneficial to accurately controlling the pattern accuracy of the second trench 142. Therefore, in some implementations, by first forming the mandrel layer 130 and then forming the first trench 141, the pattern accuracy of the first trench 141 and the second trench 142 is improved, thereby improving the pattern accuracy of the target pattern, and correspondingly improving the accuracy of the pattern transfer.

In addition, in some implementations, the first trench 141 and the second trench 142 are formed separately, which is beneficial to improving the process window for forming the first trench 141 and the second trench 142 (for example, improving the optical proximity effect or relieving the limitation to the resolution of the photolithography process), so that the pattern accuracy of the first trench 141 and the second trench 142 is guaranteed. In the second direction, the adjacent first trench 141 and second trench 142 may be isolated by the mask spacer 150, or may be isolated by the mask spacer 150 and the pattern transfer layer 160.

In some implementations, the protective layer 140 is exposed by the bottom of the second trench 142. In some implementations, the blanket etching process is used to remove the mandrel layer 130. The etching selection ratios of the mandrel layer 130 to the pattern transfer layer 160, the mask spacer 150, the barrier layer 170, as well as the protective layer 140 are relatively high. Therefore, in the process of removing the mandrel layer 130, the damage to other film layers is relatively small, and correspondingly the mandrel layer 130 can be removed using the blanket etching process, thereby simplifying process steps and reducing costs. Moreover, by using the blanket etching process, the process window for forming the second trench 142 is significantly increased. Specifically, a wet etching process is used to remove the mandrel layer 130 to form the second trench 142. The wet etching process is to remove the mandrel layer 130 in a chemical reaction manner, which is beneficial to reducing the damage to the protective layer 140 exposed by the first trench 141, and is beneficial to removing the mandrel layer 130 completely. In some implementations, the material of the mandrel layer 130 is amorphous silicon, and an etching solution used in the wet etching process is a mixed solution of $Cl_2$ and HBr or a TMAH solution.

Figure 19:
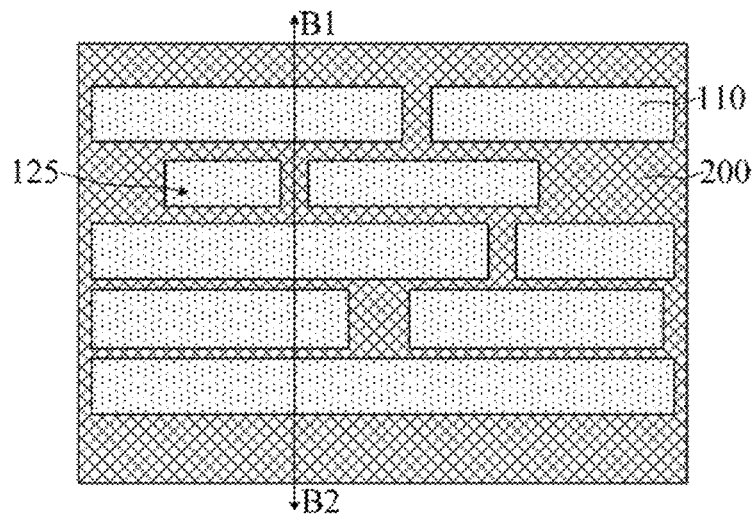
Figure 20:
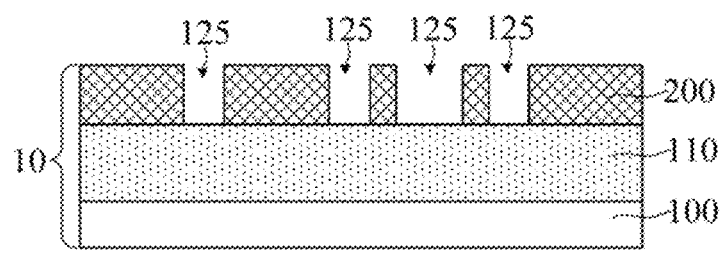

With reference to FIG. 19 and FIG. 20, FIG. 19 is a top view, and FIG. 20 is a cross-sectional view of FIG. 19 taken along the line B1B2. The base 10 is etched along the first trench 141 and the second trench 142 by using the pattern transfer layer 160 and the spacer layer 150 as the mask to form a target pattern 125.

The morphology quality, dimensional accuracy, and position accuracy of the first trench 141 and the second trench 142 are relatively high, thereby improving the pattern accuracy of the target pattern 125, and correspondingly improving the accuracy of the pattern transfer.

In some implementations, the HM material layer 120 is etched along the first trench 141 and the second trench 142, a mask opening is formed in the HM material layer 120. The mask opening is configured to be used as the target pattern 125, and the remaining HM material layer 120 is used as an HM layer 200. The HM layer 200 is configured to be used as the mask for the patterned dielectric layer 110. The patterns of the first trench 141 and the second trench 142 are transferred to the HM layer 200, and the pattern accuracy of the mask opening is correspondingly high.

In some implementations, when the target pattern 125 is formed, the mask spacer 150 and the barrier layer 170 is also used as an etching mask. The protective layer 140 (as shown in FIG. 18) is formed on the HM material layer 120. Therefore, before the HM material layer 120 is etched, the protective layer 140 is also etched.

In some implementations, after the target pattern 125 is formed, the forming method further includes: removing the pattern transfer layer 160, the mask spacer 150, the bottom remaining layer 151, the barrier layer 170, and the remaining protective layer 140. Specifically, the dry etching process is used to remove the pattern transfer layer 160, the mask spacer 150, the bottom remaining layer 151, the barrier layer 170, and the remaining protective layer 140. By adjusting parameters of the dry etching process (for example, the etching gas), the pattern transfer layer 160, the mask spacer 150, the bottom remaining layer 151, the barrier layer 170, and the remaining protective layer 140 can be removed in the same etching machine.

Figure 21:
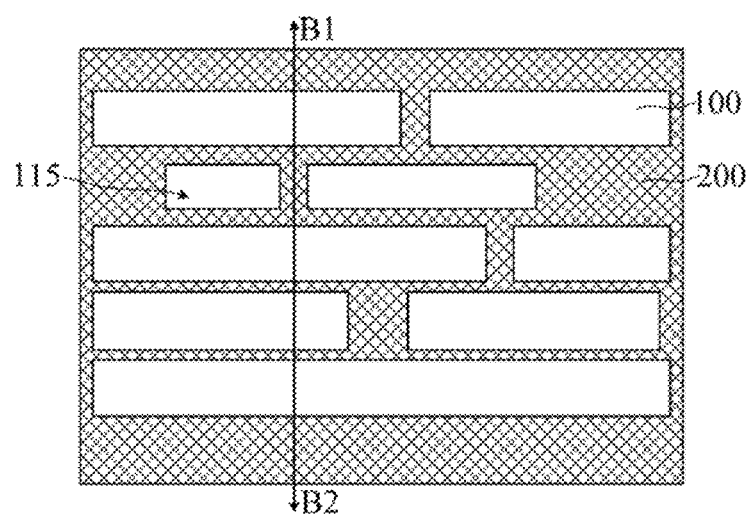
Figure 22:
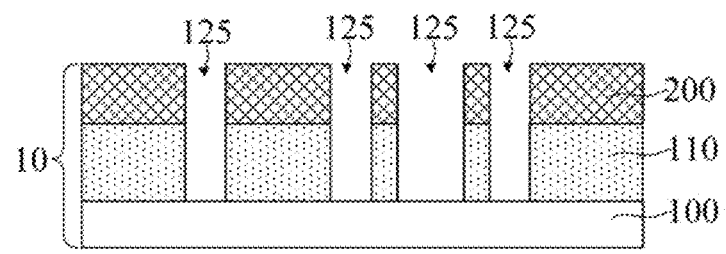

With reference to FIG. 21 and FIG. 22, FIG. 21 is a top view, and FIG. 22 is a cross-sectional view of FIG. 21 taken along the line B1B2. After the target pattern 125 is formed, the forming method further includes: etching the dielectric layer 110 along the mask opening (that is, the target pattern 125) using the HM layer 200 as the mask to form an interconnection opening 115 in the dielectric layer 110.

The interconnection opening 115 is configured to provide space for the formation of the metal interconnection line. The pattern accuracy of the mask opening is relatively high, thereby improving the pattern accuracy of the interconnection opening 115, so that the morphology and layout of the metal interconnection structure meet the design requirement, and the performance of the metal interconnection structure is correspondingly improved. It should be noted that, as the circuit integration level increases, it becomes increasingly complex to design BEOL metal wiring, and a space between adjacent metal interconnection lines keeps decreasing. By using the foregoing manner of forming the first trench 141 (as shown in FIG. 17) and the second trench 142 (as shown in FIG. 17), the position accuracy, morphology quality, and dimensional accuracy of the metal interconnection line are significantly improved, thereby improving the performance and reliability of the semiconductor structure.

Figure 23:
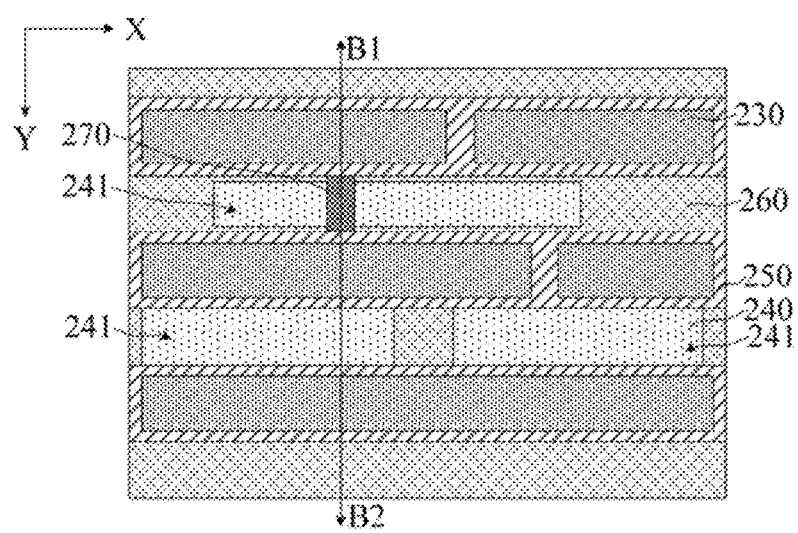
FIG. 23 and FIG. 24 are schematic structural diagrams of one form of a semiconductor structure according to the present disclosure.
Figure 24:
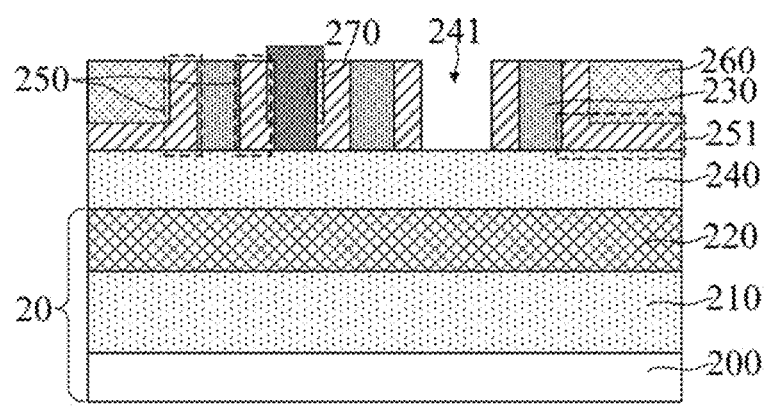

The present disclosure further provides a semiconductor structure. FIG. 23 and FIG. 24 are schematic structural diagrams of one form of the semiconductor structure according to the present disclosure. FIG. 24 is a top view, and FIG. 25 is a cross-sectional view of FIG. 24 taken along the line B1B2.

The semiconductor structure includes: a base 20; a plurality of discrete mandrel layers 230, located on the base 20, an extending direction of the mandrel layer 230 being a first direction (shown as an X direction in FIG. 23), and a direction perpendicular to the first direction being a second direction (shown as a Y direction in FIG. 23); a spacer layer 250, located on a side wall of the mandrel layer 230; a pattern transfer layer 260, located on the base 20 and covering a side wall of the spacer layer 250; and a trench 241, located in the pattern transfer layer 260 between adjacent spacer layers 250 along the second direction.

For example, the trench 241 is used as a first trench, the mandrel layer 230 is configured to occupy a position of a second trench, and the base 20 below the first trench and the second trench is subsequently etched to form a target pattern. Compared with the solution of directly forming the second trench in the pattern transfer layer, the mandrel layer 230 protrudes from the base 20. Therefore, it is easy to form the mandrel layer 230 with a relatively small size, and the size and position of the mandrel layer 230 have relatively high accuracy, which is correspondingly beneficial to accurately controlling pattern accuracy of the second trench. The first trench is located in the pattern transfer layer 260 between the adjacent spacer layers 250 along the second direction, and the accuracy of the size and position of the mandrel layer 230 is relatively high, which is correspondingly beneficial to improving the accuracy of the size and position of the first trench. In summary, the mandrel layer 230 and the first trench are beneficial to improving the pattern accuracy of the first trench and the second trench, thereby improving the pattern accuracy of the target pattern, and correspondingly improving the accuracy of the pattern transfer.

The base 20 includes a base structure layer 200, and the base structure layer 200 includes a substrate. For example, the semiconductor structure is a planar transistor, the substrate is a planar substrate. In other implementations, when the semiconductor structure is a fin field effect transistor, the substrate may alternatively be a substrate with fins. The base structure layer 200 may further include other structures, such as a gate structure, a doped region, an STI structure, and a dielectric layer. Specifically, the base structure layer 200 further includes an interlayer dielectric layer (not shown) located on the substrate and a contact hole plug (not shown) located in the interlayer dielectric layer.

In some implementations, the base 20 further includes an HM material layer 220 located on the base structure layer 200. Subsequently, a mask opening is formed in the HM material layer 220, the mask opening is configured to be used as a target pattern, the remaining HM material layer is used as an HM layer, and the pattern is transferred downward through the HM layer. It is beneficial to improving the stability of a patterning process and the accuracy of the pattern transfer using the HM material layer 220. The material of the HM material layer 220 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride. In an example, the HM material layer 220 is a metal HM material layer, and the material thereof is titanium nitride.

The base 20 further includes a dielectric layer 210 located between the base structure layer 200 and the HM material layer 220. In some implementations, the dielectric layer 210 is an IMD layer, and is configured to implement electric isolation between metal interconnection structures in a BEOL manufacturing procedure. During the formation of the semiconductor structure, after the target pattern is formed, the dielectric layer 210 is further etched along the mask opening by using the HM layer as a mask to form an interconnection opening in the dielectric layer 210. The interconnection opening is configured to provide space for the formation of the metal interconnection structure. In some implementations, the pattern accuracy of the target pattern in the HM layer is relatively high, and the pattern accuracy of the interconnection opening is also relatively high, therefore it is beneficial to improving the pattern accuracy of the metal interconnection structure. In some implementations, the material of the dielectric layer 210 is an ultra-low-k dielectric material. Specifically, the ultra-low-k dielectric material may be SiOCH.

It should be noted that the semiconductor structure further includes: a protective layer 240 located on the HM material layer 220. The protective layer 240 is configured to protect the HM material layer 220, thereby improving the accuracy of the pattern subsequently formed in the HM material layer 220. In some implementations, the material of the protective layer 140 is silicon oxide.

The material of the mandrel layer 230 is a material that may be easily removed, thereby reducing the difficulty in removing the mandrel layer 230 and reducing the damage to other film layers located below the mandrel layer 230. The material of the mandrel layer 230 includes at least one of amorphous silicon, polycrystalline silicon, monocrystalline silicon, silicon oxide, APF materials, SOC, or silicon carbide. In some implementations, the pattern transfer material layer 230 is amorphous silicon.

The spacer layer 250 is configured to isolate the second trench from the first trench (that is, the trench 241) and prevent the problem of communication between the second trench and the first trench, so that a space between the adjacent second trench and first trench meets a designed minimum space. When patterns of the second trench and the first trench are subsequently transferred to the base 20, the spacer layer 250 is further configured to be used as a mask for etching the base 20. In addition, the spacer layer 250 is configured to adjust the space between the second trench and the first trench in the second direction. Further, the spacer layer 250 is located on the side wall of the mandrel layer 230. The spacer layer 250 is used as an outer spacer, and the space between the adjacent first grooves along the first direction is not the sum of the space between the mandrel layers and twice the thickness of the spacer layer. Compared with the solution of first forming the second trench and then forming an inner spacer on the side wall of the second trench, it is beneficial to achieving a smaller space between the adjacent second trenches along the first direction by the outer spacer located on the side wall of the mandrel layer 230. The spacer layer 250 is made of a material that have etching selectivity with the mandrel layer 230, the protective layer 240, and the pattern transfer layer 260. The material of the spacer layer 250 includes one or more of titanium oxide, titanium nitride, silicon oxide, silicon nitride, silicon oxynitride, and silicon carbide. In some implementations, the material of the spacer layer 250 is silicon nitride.

The manufacturing procedure of forming the spacer layer 250 generally includes the step of conformally covering the mandrel layer 230 and the spacer material layer of the base 20, and further includes the step of etching back the spacer material layer. During the formation of the semiconductor structure, the pattern transfer layer 260 is formed before the spacer material layer is etched back. Therefore, the semiconductor structure further includes a bottom remaining layer 151 located between the pattern transfer layer 260 and the base 20, the bottom remaining layer 151 and the spacer layer 250 are of an integrated structure, and the bottom remaining layer 141 is retained when the spacer material layer is etched back. Specifically, the bottom remaining layer 151 is located between the pattern transfer layer 260 and the protective layer 240.

In some implementations, in the first direction, the spacer layers 250 on the side walls of the adjacent mandrel layers 230 are in contact with each other, and the side wall of the mandrel layer 230 in the first direction is the head of the mandrel layer 230. The spacer layer 250 located between the adjacent mandrel layers 230 in the first direction is configured to implement isolation between the adjacent mandrel layers 230 in the first direction. In other implementations, when the space between the second trenches in the first direction is relatively large, the spacer layers on the side walls of the adjacent mandrel layers may alternatively be spaced in the first direction.

The pattern transfer layer 260 is configured to be used as a mask for etching the base 20 to transfer the patterns of the first trench and the second trench to the base 20. In some implementations, the material of the pattern transfer layer 260 is silicon oxide. In other implementations, the material of the pattern transfer layer may alternatively be metal oxide, where the metal oxide includes spin-on metal oxide (for example, titanium oxide).

It should be noted that, in other implementations, when the spacer layers on the side walls of the adjacent mandrel layers are spaced in the first direction, the pattern transfer layer further fills between the adjacent spacer layers in the first direction.

In some implementations, the top surface of the pattern transfer layer 260 and the top surface of the mandrel layer 230 are flush with each other. In other implementations, the top surface of the pattern transfer layer may alternatively be higher than the top surface of the mandrel layer.

The trench 241 (that is, the first trench) is configured to define the shape, size, and position of some target patterns in subsequent processes. Specifically, the protective layer 240 is exposed by the bottom of the trench 241. According to the design requirements of the IC, in the second direction, the trench 241 is isolated from the spacer layer 250 by using the pattern transfer layer 260, or the side wall of the trench 241 in the second direction exposes the spacer layer 250. Moreover, by adjusting the space between the trench 241 and the spacer layer 250 in the second direction, the subsequently formed space between the second trench and the first trench in the second direction is adjusted.

In some implementations, the semiconductor structure further includes: a barrier layer 270, located in at least one of the trenches 241, and the barrier layer 270 divides the trench 241 in the first direction. The barrier layer 270 is configured to be used as a cut feature of the trench 241. When a pattern of the trench 241 is subsequently transferred to the base 20, the barrier layer 270 also functions as an etching mask, thereby adjusting a pitch between the pattern of the trench 241 and a target pattern corresponding to the trench 241 in the first direction. It is beneficial to increasing a process window for forming the trench 241 through the barrier layer 270, thereby improving the accuracy of the pattern transfer.

In some implementations, the material of the barrier layer 270 is silicon oxide. In other implementations, the material of the barrier layer may alternatively be LTO, titanium oxide, or silicon oxycarbide.

In an example, in the second direction, the barrier layer 270 further extends to cover the pattern transfer layer 260 between the trench 241 and the spacer layer 250. In other implementations, when a pitch between the adjacent target patterns in the first direction is relatively large, a mask may be used to directly form a trench matching the target pattern, and the semiconductor structure correspondingly does not include the barrier layer.

Although the present disclosure is disclosed above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A forming method of a semiconductor structure, comprising:
   providing a base;
   forming a plurality of discrete mandrel layers on the base, wherein an extending direction of the mandrel layers of the plurality of mandrel layers is a first direction, and a direction perpendicular to the first direction is a second direction;
   forming a plurality of spacer layers covering side walls of the mandrel layers of the plurality of mandrel layers;
   forming a pattern transfer layer on the base, wherein the pattern transfer layer covers a side wall of the spacer layers of the plurality of spacer layers;

forming a first trench in the pattern transfer layer between adjacent spacer layers of the plurality of spacer in the second direction;

removing a mandrel layer of the plurality of mandrel layers to form a second trench after the first trench is formed; and etching the base along the first trench and the second trench to form a target pattern using the pattern transfer layer and the spacer layer as a mask.

2. The forming method of a semiconductor structure according to claim 1, wherein:

the step of forming a plurality of spacer layers covering side walls of the mandrel layers of the plurality of mandrel layers comprises: forming a spacer material layer that conformally covers the plurality of mandrel layer and the base, the spacer material layer located on the side wall of the mandrel layer being used as the plurality of spacer layers; and before the mandrel layer of the plurality of mandrel layers is removed, the forming method further comprises: etching back the spacer material layer, and removing the spacer material layer higher than a top surface of the mandrel layer of the plurality of mandrel layers.

3. The forming method of a semiconductor structure according to claim 2, wherein after the pattern transfer layer is formed and before the mandrel layer of the plurality of mandrel layers is removed, the spacer material layer is etched back.

4. The forming method of a semiconductor structure according to claim 3, wherein after the pattern transfer layer is formed and before the first trench is formed in the pattern transfer layer between adjacent mandrel layers of the plurality of mandrel layers, the spacer material layer is etched back.

5. The forming method of a semiconductor structure according to claim 3, wherein:

the step of forming a pattern transfer layer comprises: forming a pattern transfer material layer covering the spacer material layer; and performing planarization on the pattern transfer material layer to remove the pattern transfer material layer higher than a top surface of the spacer material layer, where a remaining pattern transfer material layer is used as the pattern transfer layer.

6. The forming method of a semiconductor structure according to claim 5, after the spacer material layer is etched back and before the first trench is formed in the pattern transfer layer between the adjacent mandrel layers, the forming method further comprises: etching back the pattern transfer layer to enable a top surface of the remaining pattern transfer layer to be flush with the top surface of the mandrel layer.

7. The forming method of a semiconductor structure according to claim 1, wherein the method further comprises: after the first trench is formed and before the mandrel layer is removed, forming a barrier layer in the first trench, wherein the barrier layer divides the first trench in the first direction.

8. The forming method of a semiconductor structure according to claim 1, wherein:

in the step of forming a first trench in the pattern transfer layer, a side wall of the first trench in the second direction exposes the spacer layer; or, in the second direction, the first trench is isolated from the spacer layer by the pattern transfer layer.

9. The forming method of a semiconductor structure according to claim 1, wherein the step of forming a first trench in the pattern transfer layer comprises: etching the pattern transfer layer between the adjacent spacer layers using a dry etching process.

10. The forming method of a semiconductor structure according to claim 1, wherein in the step of forming a second trench, the mandrel layer is removed using a wet etching process.

11. The forming method of a semiconductor structure according to claim 1, wherein the process of forming the spacer layer comprises an atomic layer deposition process.

12. The forming method of a semiconductor structure according to claim 1, wherein a material of the mandrel layer comprises at least one of amorphous silicon, polycrystalline silicon, monocrystalline silicon, silicon oxide, advanced patterning film materials, spin on carbon, or silicon carbide.

13. The forming method of a semiconductor structure according to claim 1, wherein a material of the spacer layer comprises at least one of titanium oxide, titanium nitride, silicon oxide, silicon nitride, silicon oxynitride, or silicon carbide.

14. The forming method of a semiconductor structure according to claim 1, wherein a material of the pattern transfer layer comprises silicon oxide or metal oxide.

15. The forming method of a semiconductor structure according to claim 1, wherein:

the step of forming a plurality of discrete mandrel layers on the base comprises:

forming a plurality of discrete initial mandrel layers on the base, where an extending direction of the initial mandrel layer is a first direction, and a direction perpendicular to the first direction is a second direction; and cutting the initial mandrel layer to divide the initial mandrel layer into the plurality of mandrel layers in the first direction.

16. The forming method of a semiconductor structure according to claim 1, wherein:

the base comprises:

a base structure layer, a dielectric layer located on the base structure layer, and a hard mask material layer located on the dielectric layer;

the step of etching the base along the first trench and the second trench using the pattern transfer layer and the spacer layer as a mask comprises:

etching the hard mask material layer along the first trench and the second trench, and forming a mask opening in the hard mask material layer, where the mask opening is configured to be used as the target pattern, and a remaining hard mask material layer is used as a hard mask layer; and the method further comprises: after the target pattern is formed, etching the dielectric layer along the mask opening using the hard mask layer as a mask, and forming an interconnection opening in the dielectric layer.

* * * * *